US007829360B2

United States Patent
Arruza et al.

(10) Patent No.: US 7,829,360 B2
(45) Date of Patent: Nov. 9, 2010

(54) VERTICAL INDENT PRODUCTION REPAIR

(75) Inventors: Bernabe J. Arruza, Boca Raton, FL (US); Ronald Bozak, Delray Beach, FL (US); Kenneth Gilbert Roessler, Boca Raton, FL (US); Andrew Dinsdale, Lake Worth, FL (US); Tod Evan Robinson, Boynton Beach, FL (US); David Brinkley, Baltimore, MD (US)

(73) Assignee: Rave, LLC, Delray Beach, FL (US)

( * ) Notice: Subject to any disclaimer, the term of this patent is extended or adjusted under 35 U.S.C. 154(b) by 466 days.

(21) Appl. No.: 11/898,837

(22) Filed: Sep. 17, 2007

(65) Prior Publication Data

US 2009/0070979 A1    Mar. 19, 2009

(51) Int. Cl.
*H01L 21/00* (2006.01)

(52) U.S. Cl. .................... 438/33; 438/68; 438/113; 438/458; 438/460; 438/462; 257/E21.214

(58) Field of Classification Search ................ 438/33, 438/68, 113, 458, 460, 462
See application file for complete search history.

(56) References Cited

U.S. PATENT DOCUMENTS

| 2005/0250296 A1* | 11/2005 | Yamamura et al. | ........... 438/460 |
| 2006/0166465 A1* | 7/2006 | Ono | ........................... 438/460 |
| 2008/0070380 A1* | 3/2008 | Kusunoki | ................... 438/462 |

\* cited by examiner

*Primary Examiner*—Wai-Sing Louie
(74) *Attorney, Agent, or Firm*—Anthony R. Carlis

(57) ABSTRACT

A method of nanomachining is provided. The method includes plunging a nanometer-scaled tip into a surface of a substrate at a first location in a first direction that is substantially perpendicular to the surface, thereby displacing a first portion of the substrate with the tip. The method also includes withdrawing the tip from the substrate in a second direction that is substantially opposite to the first direction. The method further includes moving at least one of the tip and the substrate laterally relative to each other. In addition, the method also includes plunging the tip into the substrate at a second location in a third direction that is substantially parallel to the first direction, thereby displacing a second portion of the substrate with the tip and withdrawing the tip from the substrate in a fourth direction that is substantially opposite to the third direction.

20 Claims, 5 Drawing Sheets

VERTICAL INDENT PRODUCTION REPAIR

FIELD OF THE INVENTION

The present invention relates generally to novel nanomachining methods and devices.

BACKGROUND OF THE INVENTION

Nanomachining, by definition, involves mechanically removing nanometer-scaled volumes of material from, for example, a photolithography mask, a semiconductor substrate/wafer, or some other monolith. For the purposes of this discussion, "substrate" will refer to any object upon which nanomachining may be performed.

Typically, nanomachining is performed by applying forces to a surface of a substrate with a tip (e.g., a diamond cutting bit) that is positioned on a cantilever arm of an atomic force microscope (AFM). More specifically, the tip is typically first inserted into the surface of the substrate. Then, the tip is dragged through the substrate in a plane that is parallel to the surface (i.e., the xy-plane). This results in displacement and/or removal of material from the substrate as the tip is dragged along. However, this nanomachining process also results in the tip being subjected to a substantial amount of lateral stress as the tip is moved laterally in the xy-plane to displace substrate material.

One application of nanomachining involves the subtractive defect repair of photomasks. In other words, one application of nanomachining involves removing defects that form in photomasks either during the manufacturing thereof or as the masks are used over and over during photolithography. According this application, the tip is again dragged laterally, this time through the material that constitutes a defect, and is again subjected to a substantial amount of lateral stress.

As photomask and electronic device feature sizes have continued to decrease with the continued advancement of semiconductor technology, the AFM tips used for nanomachining have become high aspect ratio (HAR) tips. For example, tips currently used typically have aspect ratios of 1.3 or higher. Unfortunately, HAR tips have exhibited a propensity for deflection under traditional nanomachining methods. Thus, these tips have become more and more unsuitable for nanomachining of extremely small features, particularly those features where vertical edges are desired. These tips have also proven to be more and more unsuitable for the removal of extremely small defects buried deep in a mask or other substrate, as deflection of the tip reduces the ultimate feature-size resolution of the nanomachining process.

SUMMARY OF THE INVENTION

At least in view of the above, novel methods of nanomachining on extremely small scales would be desirable. Devices for nanomachining on such extremely small scales would also be desirable The foregoing needs are met, to a great extent, by certain embodiments of the present invention. According to one embodiment of the present invention, a method of nanomachining is provided. The method includes plunging a nanometer-scaled tip into a surface of a substrate at a first location in a first direction that is substantially perpendicular to the surface, thereby displacing a first portion of the substrate with the tip. The method also includes withdrawing the tip from the substrate in a second direction that is substantially opposite to the first direction. The method further includes moving at least one of the tip and the substrate laterally relative to each other. In addition, the method also includes plunging the tip into the substrate at a second location in a third direction that is substantially parallel to the first direction, thereby displacing a second portion of the substrate with the tip and withdrawing the tip from the substrate in a fourth direction that is substantially opposite to the third direction.

In accordance with one embodiment of the present invention, a nanomachining device is provided. The device includes means for plunging a nanometer-scaled tip into a surface of a substrate at a first location in a first direction that is substantially perpendicular to the surface, thereby displacing a first portion of the substrate with the tip. The device also includes means for withdrawing the tip from the substrate and means for moving at least one of the tip and the substrate. In addition, the device also includes means for plunging the tip into the substrate at a second location in a direction that is substantially parallel to the first direction, thereby displacing a second portion of the substrate with the tip.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
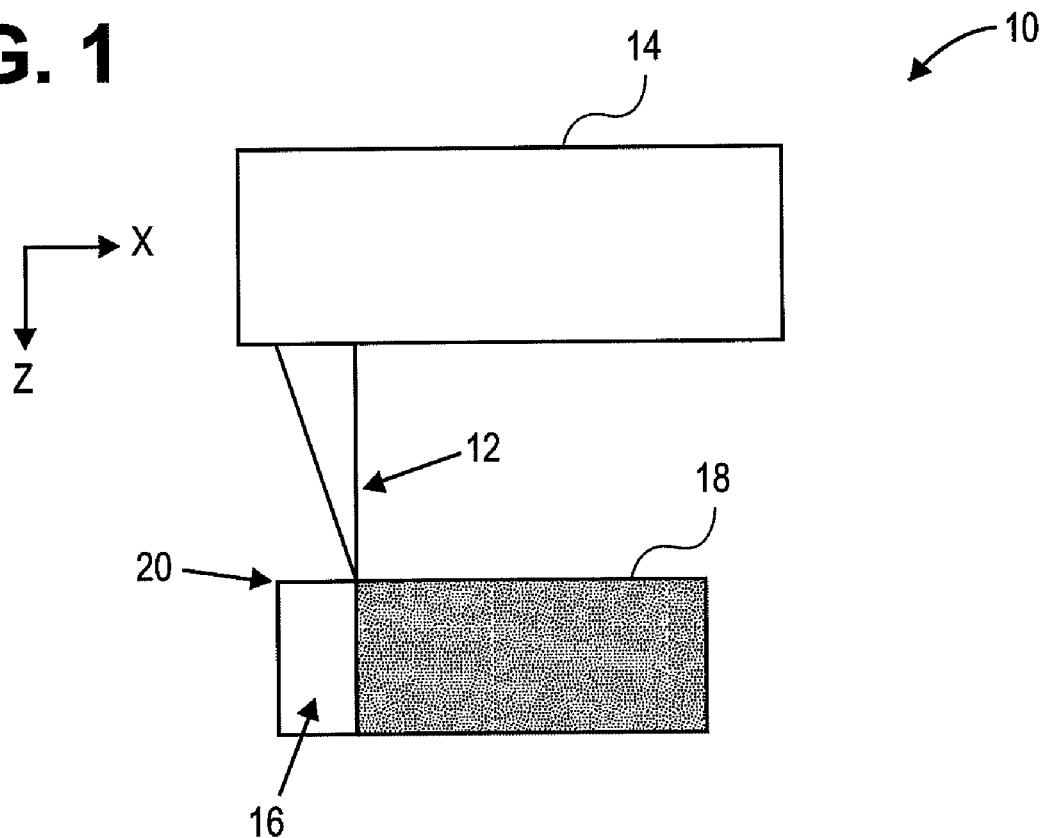
FIG. 1 is a cross-sectional view of a nanomachining device according to an embodiment of the present invention prior to plunging.

The invention will now be described with reference to the drawing figures, in which like reference numerals refer to like parts throughout. FIG. 1 illustrates a cross-sectional view of a nanomachining device 10 according to an embodiment of the present invention prior to plunging. The device 10 includes a nanometer-scaled tip 12 affixed to a cantilever 14 and positioned adjacent to a defect 16 on a substrate 18.

According to certain embodiments of the present invention, a method of nanomachining the defect 16 relative to the remainder of the substrate 18 is provided (i.e., the defect 16, which can include foreign contamination, which may be loosely or firmly attached to the remainder of the substrate 18, and which may protrude beyond the upper surface of the remainder of the substrate 18, is considered to be part of the substrate 18 until removed). According to this method, the tip 12 is plunged into a surface 20 of the substrate 18 at a first location that includes the defect, as illustrated in FIG. 2, which illustrates a cross-sectional view of the device 10 illustrated in FIG. 1 during such a plunging step.

Figure 2:
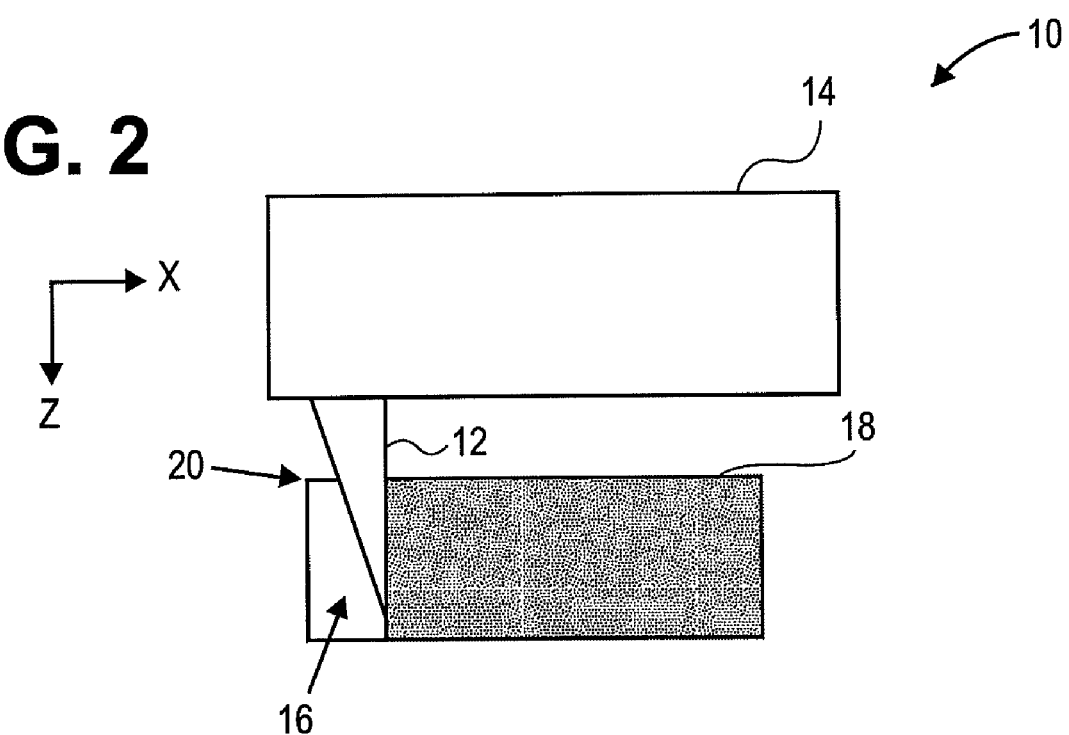
FIG. 2 is a cross-sectional view of a nanomachining device according to an embodiment of the present invention during plunging.

As illustrated in FIG. 2, the tip 12 is plunged in a direction along the z-axis that is substantially perpendicular to the surface 20. This plunging displaces a portion of the material in the substrate with the tip 12.

Figure 3:
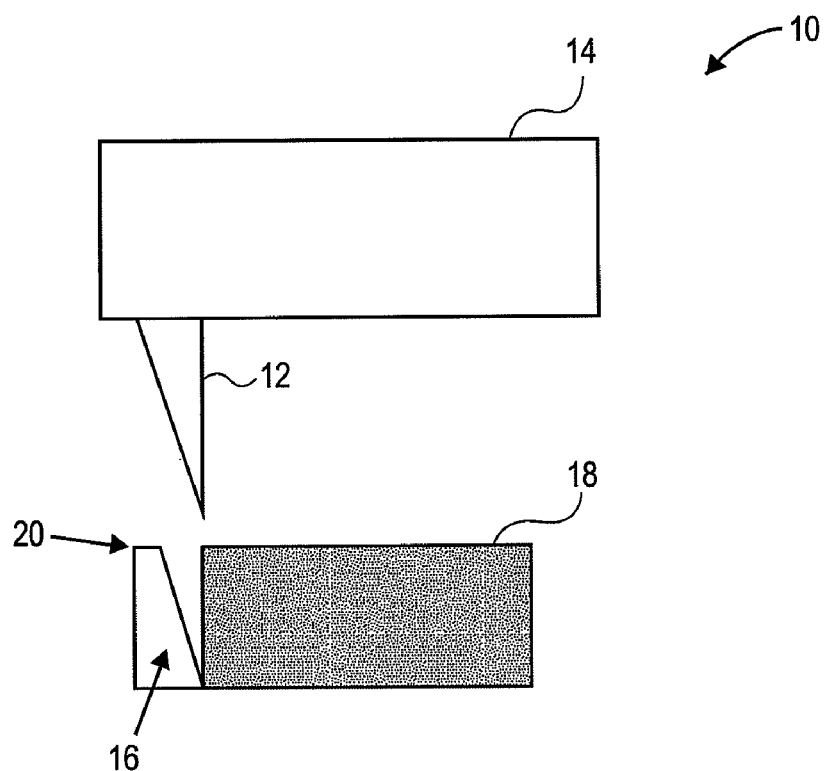
FIG. 3 is a cross-sectional view of a nanomachining device according to an embodiment of the present invention subsequent to withdrawal.

FIG. 3 is a cross-sectional view of the device 10 subsequent to withdrawal of the tip 12 from the substrate. As illustrated in FIG. 3, the above-discussed method includes withdrawing the tip 12 from the substrate 18 in a second direction along the z-axis, wherein the second direction is substantially opposite to the first direction in which the tip 12 was plunged into the substrate 18.

Although not explicitly illustrated, according to other embodiments of the present invention, while the tip 12 illustrated in FIGS. 1-3 is interacting with the substrate 18, one or more additional tips may also be plunged into the substrate 18, particularly if additional cantilevers or other tip support structures are available.

When applied to a photomask, the steps illustrated of the above-discussed method illustrated in FIGS. 1-3 may remove an edge defect on a photomask by plunging the tip 12 all of the way through the defect as one indent. Then, the plunging may be repeated across the xy-plane (i.e., into the paper when looking at FIGS. 1-3) until the defect 16 is removed from the substrate 18. Under such circumstances, the method includes moving the tip 12 and the substrate 18 laterally relative to each other. This may be done either by moving the tip 12 or the substrate 18. Then, the tip 12 is plunged into the substrate 18 at a second location and in a third direction that is substantially parallel to the z-axis and to the first direction in which the tip 12 was plunged. This step displaces a second portion of the substrate 18 with the tip 12, typically within a region of the substrate 18 defined as the defect 16. Pursuant to plunging the tip 12 at this second location, the tip is again withdrawn from the substrate 18, this time in a fourth direction that is substantially opposite to the third direction.

Figure 4:
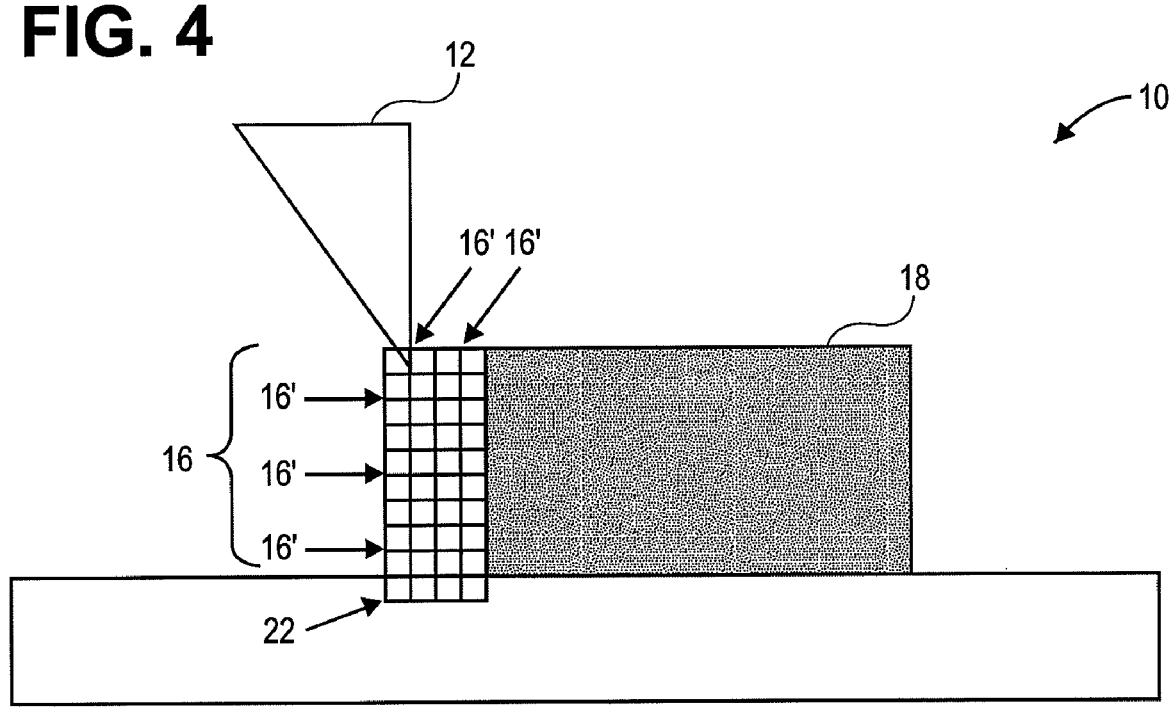
FIG. 4 is a cross-sectional view of a nanomachining device wherein multiple plunges are about to be performed.

FIG. 4 is a cross-sectional view of a nanomachining device 10 wherein multiple plunges are about to be performed. As illustrated in FIG. 4, a plurality of defect portions 16' are illustrated, and the tip 12 is not used to plunge through all of the portions 16' at the same time. Rather, a series of plunges and withdrawals are to be performed, each creating an indent in the substrate 18 and removing a single portion 16'.

The indents used to remove the portions 16' may be formed at regular or irregular intervals. Also, some plunging locations will be adjacent to others while some plunging locations with be located substantially immediately below others until all of the defect 16 portion of the substrate 18 is removed. Particularly when making a plurality of plunges immediately below each other, a substantially straight vertical wall may be formed in the substrate. However, according to certain embodiments of the present invention, plunges may be positioned relative to each other in any manner that allows for the resulting structure (i.e., after material has been removed) to match an angle of a reference structure in the substrate 18 (e.g., a sidewall).

As discussed above, the methods discussed herein may be applied to photolithography masks, particularly to remove edge defects. However, certain embodiments of the present invention are related to indenting in order to do repairs on surfaces (e.g., the surfaces of masks used in semiconductor processes, the surfaces of integrated circuits, the surfaces of semiconductor wafers, etc.). Also, although diamond tips are often used according to the above-discussed method, other materials (e.g., silicon and nanotubes) may also be used to form the tip 12 illustrated in FIGS. 1-4.

Several tip shapes are within the scope of the present invention. For example, the right triangle shape of the tip 12 illustrated in FIGS. 1-4 is particularly suitable for removing edge defects that protrude from a side (i.e., a "critical edge") of an item in a photolithography mask. However, according to other methods according to embodiments of the present invention, conical shapes, symmetrical shapes, etc. may be used. Also, although all sizes of tips are within the scope of the present invention, the apex of some tips may measure 100 Angstroms or less.

An advantage of certain embodiments of the present invention is that the tip 12 moves in a vertical direction while plunging. As such, the forces applied to the tip 12 are largely compressive in nature. Hence, even a relatively "weak" tip may preserve its shape (i.e., not substantially deflect) since only a small amount of lateral forces are encountered, if any.

Also illustrated in FIG. 4 is a row of squares that define an offset 22. This offset 22 is additional substrate 18 material that is to be removed below the defect 16. Since photomasks sometimes include chrome, MoSi, or other materials, and since these materials sometimes lead to the formation of defects made up of metal oxides, the offset 22 may be formed to eliminate any chrome, MoSi, or other material that may have been pushed down into other regions of the mask (i.e., in the quartz that is often used to make a mask) during the nanomachining. The offset 22 may also remove material that may have migrated into the region below the defect 16 and/or to compensate for optical shifting.

Figure 5:
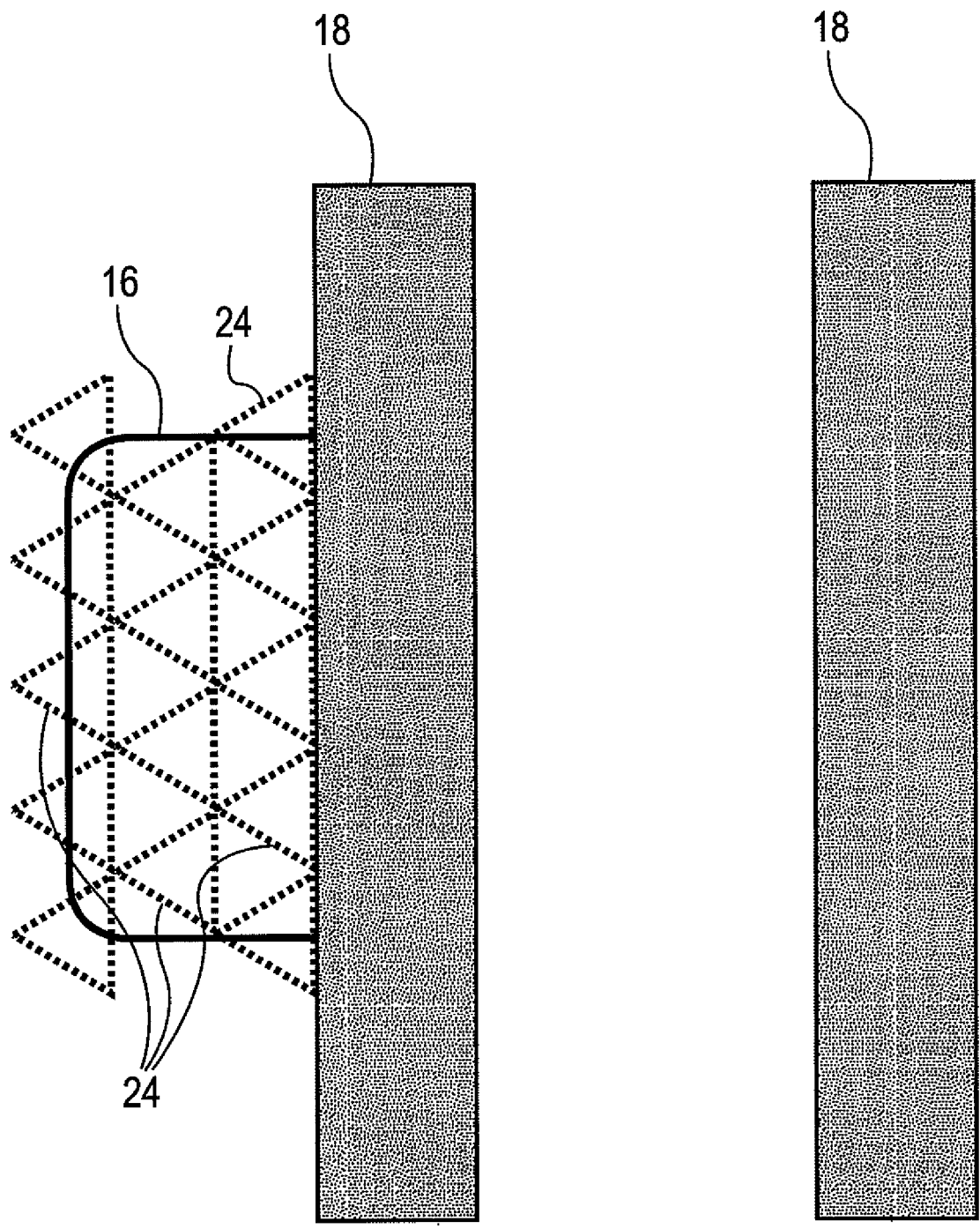
FIG. 5 is a top down view of multiple steps of a nanomachining method according to certain embodiments of the present invention.

FIG. 5 is a top down view of multiple steps of a nanomachining method according to certain embodiments of the present invention. According to the illustrated method, in the step illustrated on the left, a series of plunges are made with a tip (not illustrated) to form indents 24 in the defect 16 on the substrate 18. As will be appreciated by those of skill in the art, the indents 24 illustrated in FIG. 5 are made with a tip having a cross-sectional area in the shape of an equilateral triangle. However, other tip shapes may also be used.

According to certain embodiments of the present invention, the first indent 24 formed in the defect 16 are those in the row of indents located immediately adjacent to the substrate 18. One reason for forming the indents 24 closest to the substrate 18 first is that they clearly define the desired edge of the substrate 18 from the outset of the method being performed. Another reason for forming the indents 24 closest to the substrate 18 first is that the tip making the indents 24 is less likely to slip relative to the material in the defect 16. In other words, the tip is likely to get a better "grip" on the material in the defect 16 and to reduce the potential for drift in the system. In contrast, indents 24 made on the outer portion of the defect 16 may not interact with as much defect 16 material and therefore may get a lesser grip.

Once all of the indents 24 illustrated on the left of FIG. 5 have been made in the plane illustrated in FIG. 5, the material in that plane has typically been removed and additional indents 24 are made in the defect 16 in lower planes until all of the defect 16 has been removed. As illustrated on the right side of FIG. 5, the indents 24 discussed above, according to certain embodiments of the present invention, fully remove the defect 16 from the substrate 18. However, according to other embodiments of the present invention, the substrate 18 may be cleaned via any process known in the art to remove debris and/or residual material from the substrate (e.g., cryogenic cleaning, plasma cleaning, local cleaning, or any other type of mechanical/physical or chemical cleaning process).

Figure 6:
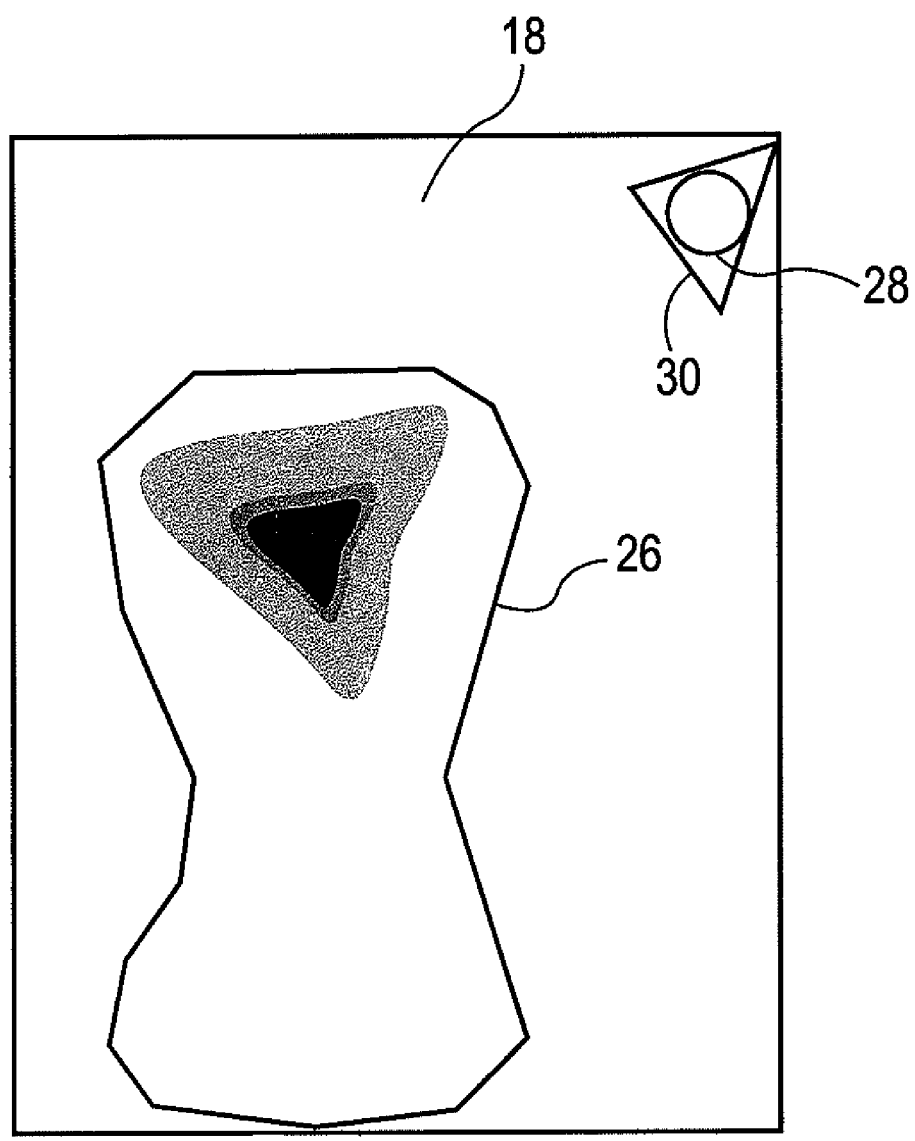
FIG. 6 is top view of a substrate where a single plunging step has been performed.
Figure 7:
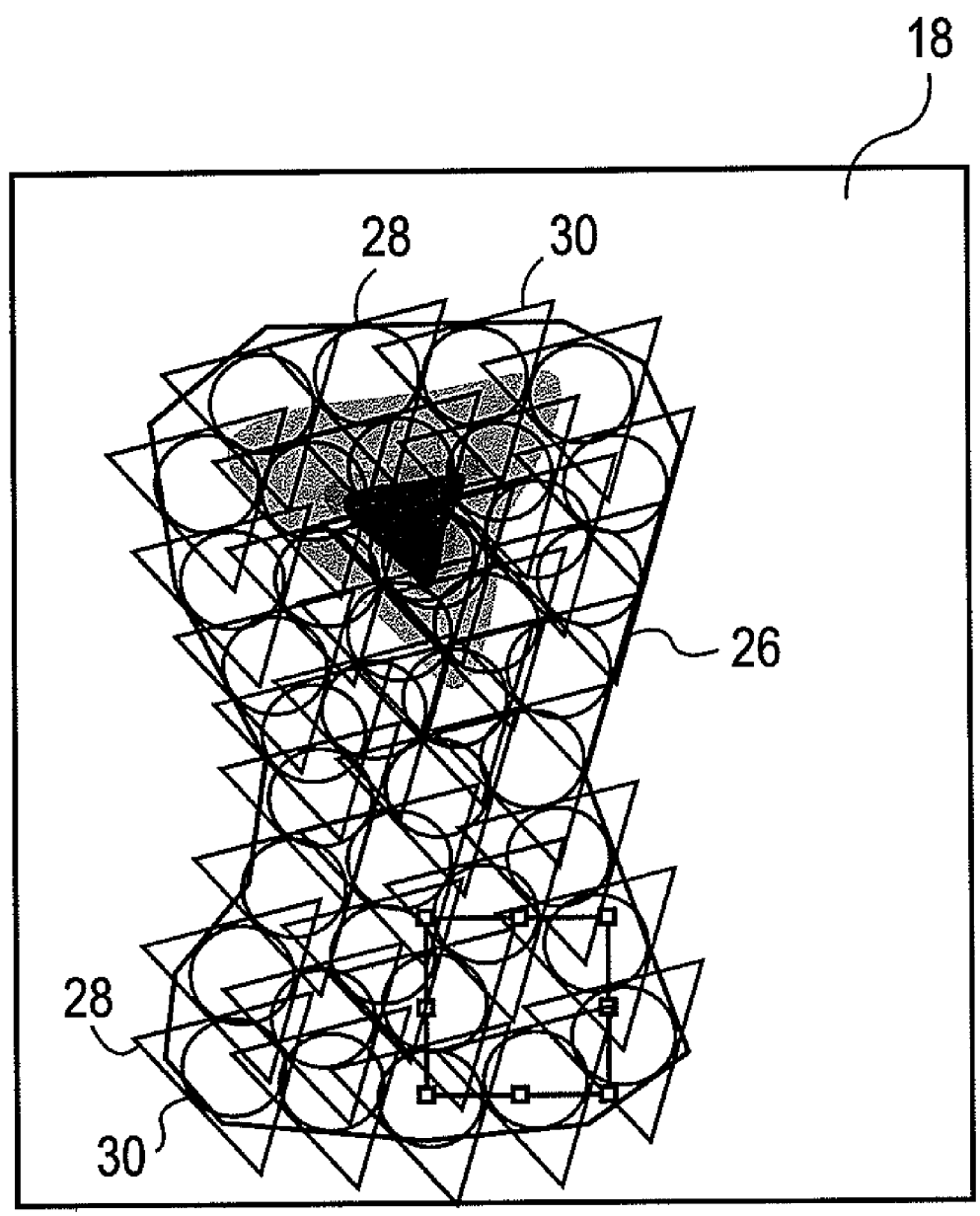
FIG. 7 is a top view of a substrate where multiple plunging steps are to be performed.

FIG. 6 is top view of a substrate 18 where a single plunging step has been performed. FIG. 7 is a top view of a substrate 18 where multiple plunging steps are to be performed. In FIGS. 6 and 7, an overall perimeter 26 of a complex shape that is desired to be formed in (i.e., carved out of) the substrate 18 is illustrated. More particularly, the overall perimeter 26 of an hourglass shape is illustrated.

The interior plunge perimeter 28 defines a cross-sectional area where the tip 12 has a relatively deep effect on the substrate 18 pursuant to being plunged therein and withdrawn therefrom. The exterior plunge perimeter 30 defines a cross-sectional area where the tip 12 has a relatively shallow effect on the substrate 18 pursuant to being plunged therein and withdrawn therefrom. The combination of the interior and exterior plunge perimeters 28, 30 serve as references that, according to certain embodiments of the present invention, to determine how many indents may be formed within the overall perimeter 26 of the hourglass shape.

A manual process may be used to draw the circle and triangle illustrated in FIGS. 6 and 7 and/or to fill the overall perimeter 26. However, this process may also be automated using, for example, image recognition software and/or an algorithm that determines where to ideally place the tip. According to certain embodiments of the present invention, the number of plunges to be made about the perimeter of the desired pattern is determined by maximizing the number of plunges that have their interior plunge perimeters in contact with the perimeter of the desired pattern.

According to certain embodiments of the present invention, when forming the hourglass shape illustrated in FIGS. 6 and 7, the initial indents are formed on the periphery of the desired shape, as opposed to the center thereof. In such circumstances, the material in the center of the desired shape sometimes ejects as a result (i.e., the material gets levered out of the center). However, according to other embodiments of the present invention, plunges are also made throughout the interior of the shape, as illustrated in FIG. 7.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of nanomachining, the method comprising:
   plunging a nanometer-scaled tip into a surface of a substrate at a first location in a first direction that is substantially perpendicular to the surface, thereby displacing a first portion of the substrate with the tip;
   withdrawing the tip from the substrate in a second direction that is substantially opposite to the first direction;
   moving at least one of the tip and the substrate laterally relative to each other;
   plunging the tip into the substrate at a second location in a third direction that is substantially parallel to the first direction, thereby displacing a second portion of the substrate with the tip; and
   withdrawing the tip from the substrate in a fourth direction that is substantially opposite to the third direction.

2. The method of claim 1, wherein the second location is located substantially immediately below the first location.

3. The method of claim 1, where in the second location is adjacent to the first location.

4. The method of claim 3, further comprising:
   plunging the tip into the substrate at a third location, wherein the third location is adjacent to the second location, and wherein the first, second, and third locations are spaced at a substantially regular interval.

5. The method of claim 3, further comprising:
   plunging the tip into the substrate at a third location, wherein the third location is adjacent to the second location, and wherein the first, second, and third locations are spaced at an irregular interval.

6. The method of claim 1, wherein the substrate comprises a photolithography mask.

7. The method of claim 1, further comprising:
   substantially preventing deflection of the tip during either of the plunging steps.

8. The method of claim 1, further comprising:
   plunging the tip into the surface at a plurality of additional locations about a perimeter of a desired pattern.

9. The method of claim 8, further comprising:
   ejecting material within the perimeter.

10. The method of claim 8, further comprising:
    plunging the tip into the surface at a plurality of additional locations about an interior portion of the desired pattern.

11. The method of claim 1, further comprising:
    cleaning the substrate.

12. The method of claim 2, further comprising:
    matching an angle of a reference sidewall in the substrate.

13. The method of claim 1, wherein the tip is asymmetrically shaped.

14. The method of claim 13, wherein the tip is substantially triangularly shaped, and wherein one side of the tip is positioned substantially perpendicular to the substrate.

15. The method of claim 2, further comprising:
    forming a substantially straight vertical wall in the substrate pursuant to the plunging steps.

16. The method of claim 15, further comprising:
    removing a protrusion from an otherwise substantially vertical wall using additional plunging and removing steps.

17. The method of claim 16, further comprising:
    removing additional material beneath the protrusion once the protrusion has been removed.

18. The method of claim 8, further comprising:
    defining an interior plunge perimeter wherein the tip has a relatively deep effect on a substrate pursuant to plunging; and
    determining a number of plunges to be made about the perimeter of the desired pattern by maximizing the number of plunges that have their interior plunge perimeters in contact with the perimeter of the desired pattern.

19. The method of claim 18, further comprising:
    utilizing image-recognition software to perform the determining step in an automated manner.

20. The method of claim 1, further comprising:
    simultaneously plunging a second nanometer-scaled tip into the surface of a substrate at a third location of the substrate.

* * * * *